United States Patent
Sato et al.

(10) Patent No.: US 10,959,322 B2
(45) Date of Patent: Mar. 23, 2021

(54) PRINTED CIRCUIT BOARD

(71) Applicant: Tyco Electronics Japan G.K., Kanagawa (JP)

(72) Inventors: Kenta Sato, Kanagawa (JP); Heewon Jeong, Kanagawa (JP)

(73) Assignee: Tyco Electronics Japan G.K., Kanagawa (JP)

( * ) Notice: Subject to any disclaimer, the term of this patent is extended or adjusted under 35 U.S.C. 154(b) by 197 days.

(21) Appl. No.: 16/022,921

(22) Filed: Jun. 29, 2018

(65) Prior Publication Data

US 2019/0008034 A1  Jan. 3, 2019

(30) Foreign Application Priority Data

Jun. 29, 2017 (JP) ............................. JP2017-127017

(51) Int. Cl.
*H05K 1/02* (2006.01)
*H05K 1/14* (2006.01)
(Continued)

(52) U.S. Cl.
CPC ............ *H05K 1/0268* (2013.01); *B60T 7/042* (2013.01); *B60T 8/00* (2013.01); *B60T 8/17* (2013.01); *B60T 8/3675* (2013.01); *G01D 11/245* (2013.01); *H01R 12/585* (2013.01); *H05K 1/113* (2013.01); *H05K 1/114* (2013.01); *H05K 1/141* (2013.01); *H05K 5/006* (2013.01); *H05K 5/0069* (2013.01); *H05K 1/181* (2013.01);
(Continued)

(58) Field of Classification Search
CPC ...... H05K 1/0268; H05K 1/113; H05K 1/114; H05K 1/141; H05K 1/181; H05K 1/14; H05K 1/142; H05K 5/006; H05K 5/0069; H05K 5/0017; H05K 5/0004; H05K 5/0047
See application file for complete search history.

(56) References Cited

U.S. PATENT DOCUMENTS 6,791,170 B1 * 9/2004 Fuku .................... H05K 7/1417
257/678
9,527,485 B2  12/2016 Nakamura et al.
(Continued)

FOREIGN PATENT DOCUMENTS

CN  206073906 U  4/2017
JP  6-53347 A   2/1994
(Continued)

OTHER PUBLICATIONS

Office Action, dated Mar. 5, 2018, 4 pages.
(Continued)

*Primary Examiner* — Helen C Kwok
(74) *Attorney, Agent, or Firm* — Barley Snyder

(57) ABSTRACT

A printed circuit board comprises a board main body, a sensor, an external connection pad, and a hollow-structured electrical conductor. The board main body has a top face and a bottom face opposite the top face. The sensor is mounted on one of the top face and the bottom face of the board main body. The external connection pad is provided on the top face or the bottom face of the board main body opposite the sensor. The hollow-structured electrical conductor extends through the board main body and electrically connects the sensor to the external connection pad.

18 Claims, 7 Drawing Sheets

(51) Int. Cl.
   *H05K 1/11*      (2006.01)
   *H05K 5/00*      (2006.01)
   *H05K 1/18*      (2006.01)
   *B60T 8/17*      (2006.01)
   *B60T 8/36*      (2006.01)
   *B60T 8/00*      (2006.01)
   *B60T 7/04*      (2006.01)
   *G01D 11/24*     (2006.01)
   *H01R 12/58*     (2011.01)

(52) U.S. Cl.
   CPC .............. *H05K 2201/049* (2013.01); *H05K 2201/09154* (2013.01); *H05K 2201/09418* (2013.01); *H05K 2201/09427* (2013.01); *H05K 2201/09481* (2013.01); *H05K 2201/10151* (2013.01); *H05K 2201/10295* (2013.01); *H05K 2201/10303* (2013.01); *H05K 2203/168* (2013.01)

(56) References Cited

U.S. PATENT DOCUMENTS

| | | | |
|---|---|---|---|
| 9,538,656 | B2 | 1/2017 | Jeanneteau et al. |
| 9,640,453 | B2 | 5/2017 | Egusa et al. |
| 2013/0241013 | A1* | 9/2013 | Yamanaka ............ B81B 7/0058 257/420 |
| 2013/0312517 | A1* | 11/2013 | Jeong .................... G01P 15/125 73/504.04 |
| 2014/0369017 | A1* | 12/2014 | Jeanneteau ........... H05K 1/141 361/803 |
| 2016/0244088 | A1 | 8/2016 | Hagiwara |
| 2016/0315022 | A1* | 10/2016 | Egusa .................. H01L 25/072 |

FOREIGN PATENT DOCUMENTS

| | | |
|---|---|---|
| JP | 9-92746 A | 4/1997 |
| JP | 2003-8184 A | 1/2003 |
| JP | 2005172716 A | 6/2005 |
| JP | 2009-158567 A | 7/2009 |
| JP | 2015107750 A | 6/2015 |
| JP | 5945828 B2 | 6/2016 |
| WO | 2014132803 A1 | 9/2014 |

OTHER PUBLICATIONS

Abstract of JP2009158567, dated Jul. 16, 2009, 1 page.
Abstract of JP2015107750, dated Jun. 11, 2015, 1 page.
Abstract of JP2015107749, related to JP5945828, dated Jul. 5, 2016, 1 page.
Extended European Search Report, European Patent Application No. 18179715.0, dated Nov. 19, 2018, 7 pages.
Abstract of CN206073906U, dated Apr. 5, 2017, 1 page.
Japanese Office Action, dated Jun. 19, 2017, 3 pages.
Abstract of JP2005172716 dated Jun. 30, 2005, 1 page.

\* cited by examiner

PRINTED CIRCUIT BOARD

CROSS-REFERENCE TO RELATED APPLICATION

This application claims the benefit of the filing date under 35 U.S.C. § 119(a)-(d) of Japanese Patent Application No. 2017-127017, filed on Jun. 29, 2017.

FIELD OF THE INVENTION

The present invention relates to a printed circuit board and, more particularly, to a printed circuit board capable of being programmed and/or inspected before it is installed in electronic equipment.

BACKGROUND

Many different types of electronic equipment include a printed circuit board on which an Integrated Circuit ("IC") chip, a capacitor, and the like, are disposed. Japanese Patent Application No. 2003-008184A, for example, discloses a printed circuit board having a pair of first pads $2a$, $2b$ disposed at a predetermined interval and a pair of second pads $2c$, $2d$ provided between the first pads $2a$, $2b$. The pair of second pads $2c$, $2d$ allow excessive solder overflowing from the pair of pads $2a$, $2b$ to adhere thereto, preventing a solder ball from being formed.

A printed circuit board is required to undergo processing for operation of the IC chip, such as programming, and/or an inspection to determine whether it operates properly for the IC chip. Such an inspection is conventionally performed after the printed circuit board is loaded in a housing, such as a package. Consequently, when the printed circuit board is found to be defective, it has to be discarded together with the housing, which is wasteful and increases costs.

SUMMARY

A printed circuit board comprises a board main body, a sensor, an external connection pad, and a hollow-structured electrical conductor. The board main body has a top face and a bottom face opposite the top face. The sensor is mounted on one of the top face and the bottom face of the board main body. The external connection pad is provided on the top face or the bottom face of the board main body opposite the sensor. The hollow-structured electrical conductor extends through the board main body and electrically connects the sensor to the external connection pad.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
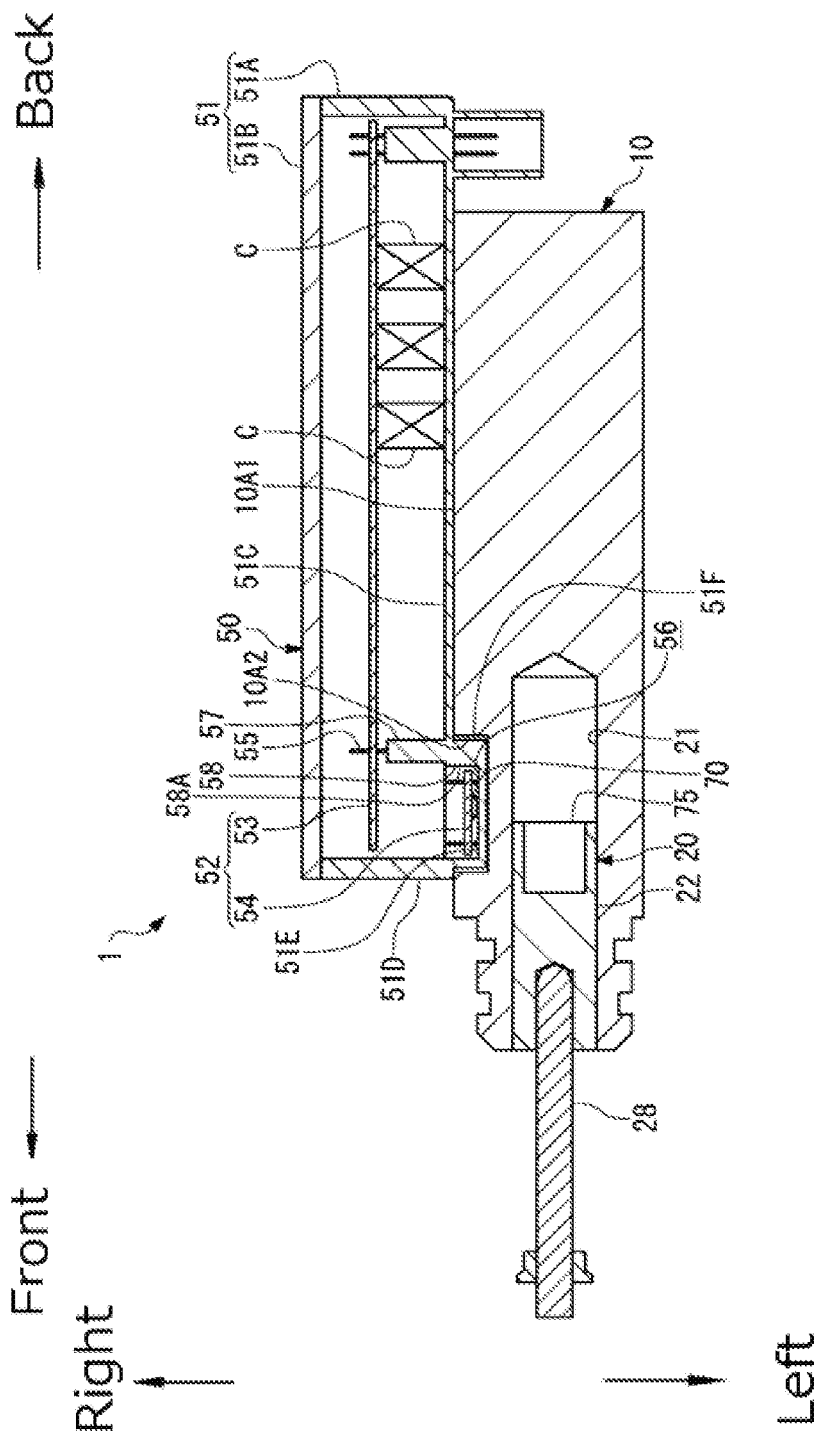
FIG. 1 is a sectional side view of an input device having a brake control unit with a printed circuit board according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

The printed circuit board according to the present invention will be described with reference to an embodiment used in a brake control unit 50. The printed circuit board and brake control unit 50 are applied to an input device 1 included in a brake system for a vehicle for generating brake fluid pressure according to a manipulated variable of a brake pedal.

The input device 1, as shown in FIG. 1, has a base 10 that is a substantially rectangular parallelepiped enclosure made of a non-magnetic metal material, a master cylinder 20 for generating brake fluid pressure by brake pedal force, and the brake control unit 50. The brake control unit 50 controls the operation of a motor (not shown) for driving a motor cylinder (not shown) for generating brake fluid pressure, on the basis of information obtained from a stroke sensor 70 and/or a pre-stored program or the like. Directional language, such as top and back or right and left, in the following description is used for convenience in describing the input device 1, and they generally correspond to directions when the input device 1 is loaded in a vehicle.

The master cylinder 20, as shown in FIG. 1, has a piston 22 inserted into a cylinder cavity 21 of the base 10 and a permanent magnet 75 forming a sensed member at a distal end of the piston 22.

Figure 2:
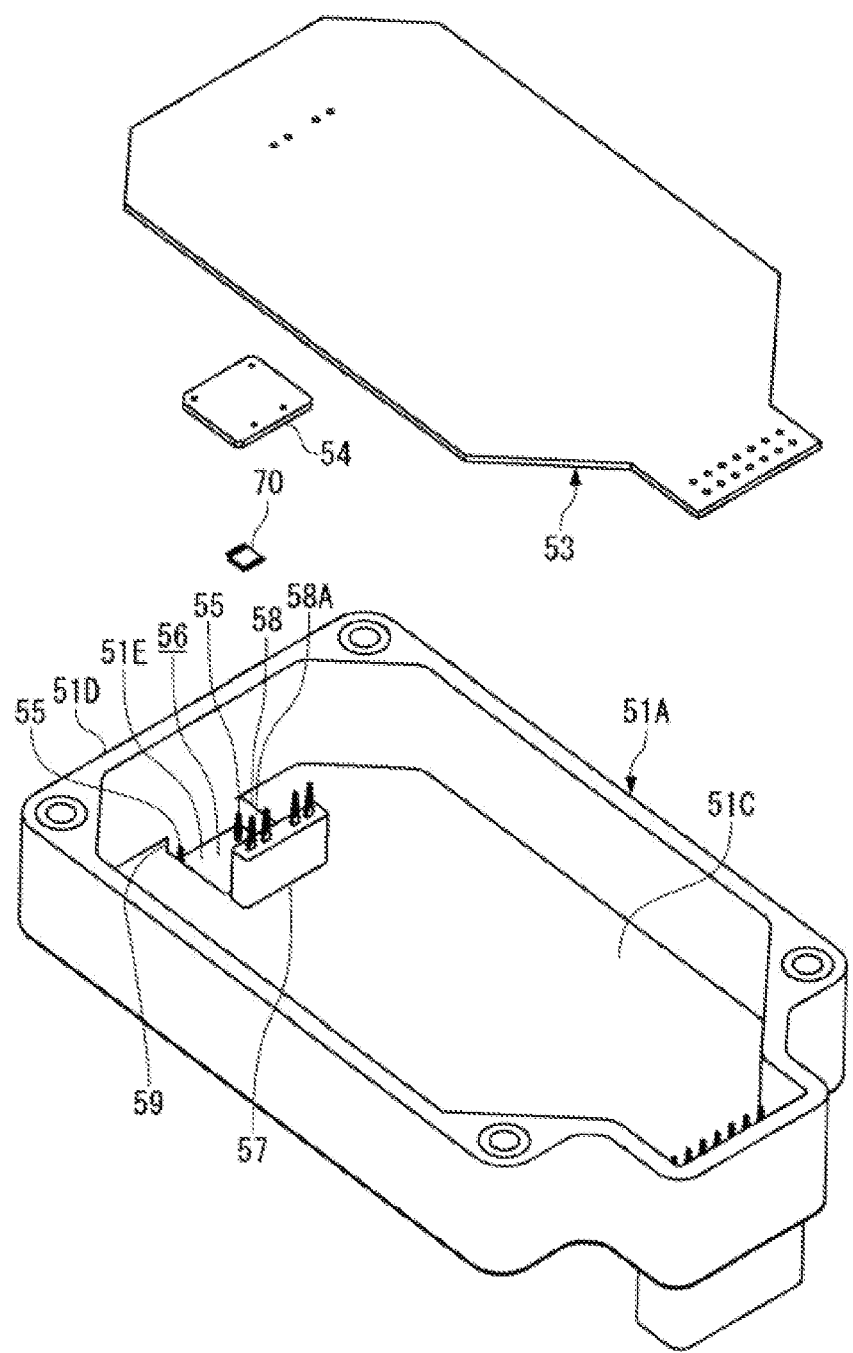
FIG. 2 is an exploded perspective view of the brake control unit of the input device of FIG. 1 with a main board and a sensor board detached.

The brake control unit 50, as shown in FIGS. 1 and 2, has a housing 51 formed as a resin enclosure attached to a right side face 10A1 of the base 10. The housing 51, as shown in FIG. 1, accommodates a control board 52 in its internal space. The housing 51 has a sensor accommodating portion 51F protruding leftward from a face opposite the base 10. Inside the sensor accommodating portion 51F, an accommodating recess 58 communicating with the internal space of the housing 51 is formed. In the accommodating recess 58, a sensor board 54 and the stroke sensor 70 are accommodated. The housing 51 further contains a coil C positioned therein as shown in FIG. 1. In the shown embodiment, the sensor board 54 is the printed circuit board of the present invention.

The housing 51, as shown in FIG. 1, has a main body 51A for accommodating the control board 52 therein, and a lid 51B for closing an opening of the main body 51A. The main body 51A has an open-topped box shape and, in an embodiment, is integrally formed by injection molding of an electrically-insulating resin. A connection terminal 55 for making an electrical connection between the main board 53 and the sensor board 54 of the control board 52 is disposed in the main body 51A and, as shown in FIG. 2, a portion provided for the connection protrudes into an accommodating region 56. The connection terminal 55 is insert-molded integrally when the main body 51A is produced by injection molding.

The main body 51A, as shown in FIGS. 1 and 2, has the accommodating region 56 for accommodating the sensor board 54. The accommodating region 56 is a substantially-rectangular parallelepiped-like space enclosed with an inner peripheral face 58A of the accommodating recess 58 opened in a bottom face 51C near a side wall 51D. The accommodating region 56 has an opening area allowing the sensor board 54 to be accommodated with a suitable gap therearound. A bottom floor 51E inside the accommodating region 56 is located closer to the master cylinder 20 than the bottom face 51C of the main body 51A.

Figure 7:
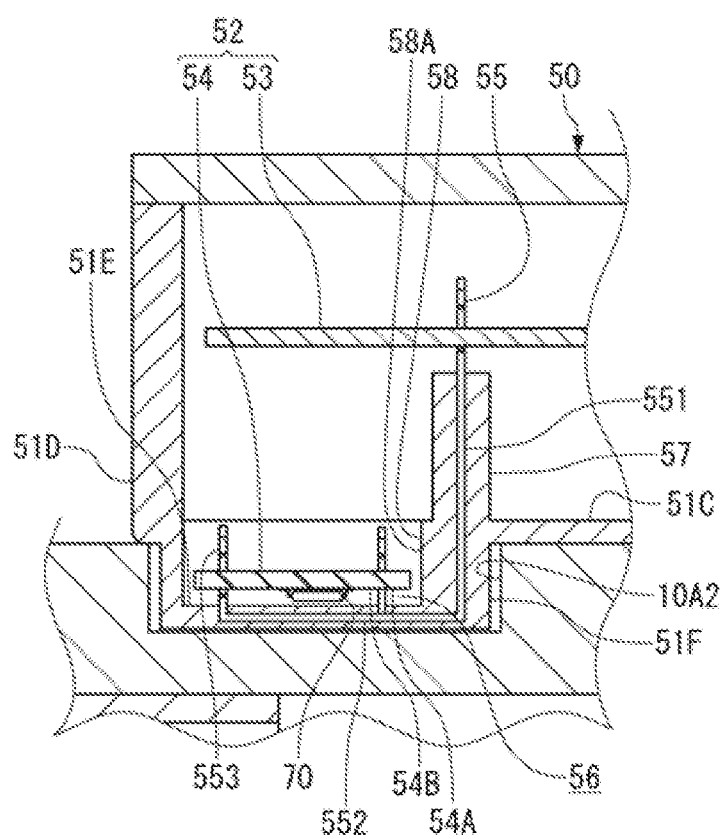
FIG. 7 is a sectional side view of a portion of FIG. 1.

The connection terminal 55 is provided within and extends beyond the accommodating region 56, as shown in FIGS. 1 and 2. The connection terminal 55 is formed of a metal material having excellent conductivity, for example, copper or a copper alloy. The connection terminal 55, as shown in FIG. 7, has an L-shape and includes a first connection portion 551 vertical to the bottom face 51C outside the accommodating region 56, a buried portion 552 extending into the first connection portion 551 and parallel to the bottom floor 51E, and a second connection portion 553 extending into the buried portion 552 and vertically from the bottom floor 51E. The first connection portion 551 extends through a partition 57 at a boundary between the accommodating recess 58 and the bottom face 51C. The first connection portion 551 and the second connection portion 553 each have an eye-of-needle type press-fit terminal element at their distal ends in order to secure a stable electrical connection with the main board 53 and the sensor board 54, respectively.

The second connection portion 553, as shown in FIG. 7, extends from the bottom floor 51E, and the distal end portion of the second connection portion 553 is exposed inside the accommodating region 56. The connection terminal 55 has the first connection portion 551 electrically connected with the main board 53 and the second connection portion 553 electrically connected with the sensor board 54. That is, the main board 53 and the sensor board 54 are electrically connected via the connection terminal 55, so that electric power is supplied from the main board 53 to the sensor board 54 via the connection terminal 55 and, in addition, a sensing signal of the stroke sensor 70 is inputted from the sensor board 54 to the main board 53 via the connection terminal 55.

Figure 5A:
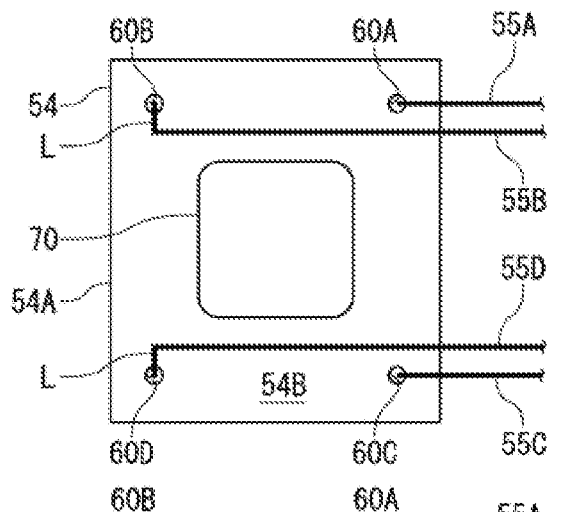
FIG. 5A is a bottom plan view of an embodiment of the sensor board.

The present embodiment uses four connection terminals 55 as shown in FIG. 2, two of which are exposed in the accommodating region 56 near the side wall 51D, and the remaining two of which are exposed in the accommodating region 56 far from the side wall 51D. As shown in FIG. 5A, four connection terminals 55A, 55B, 55C, 55D are press-fitted into through-holes 60A, 60B, 60C, 60D forming hollow-structured electrical conductors provided at four corners of the sensor board 54, thereby mechanically supporting the sensor board 54 while the main board 53 and the sensor board 54 are electrically connected. Throughout the description, the connection terminal 55 is written as connection terminals 55A, 55B, 55C, 55D when they need to be distinguished, or they are collectively referred to as connection terminal 55 when they do not need to be distinguished.

Figure 3:
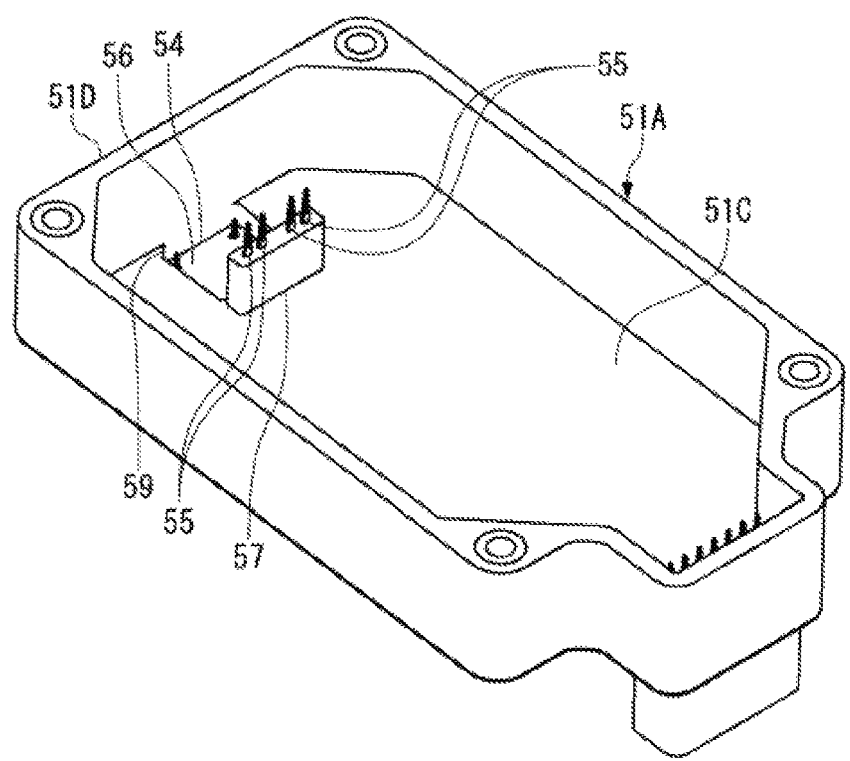
FIG. 3 is a perspective view of the brake control unit of the input device of FIG. 1 with the sensor board disposed in an accommodation region.

The accommodating region 56 has a region between the sensor board 54 and the bottom floor 51E shielded from outside to such an extent as to avoid receiving a foreign matter from outside, since the sensor board 54 is supported with the connection terminals 55 inside the accommodating region 56, as shown in FIGS. 1 and 3. The stroke sensor 70 mounted on the sensor board 54 positioned in this region avoids receiving a foreign matter from outside.

The control board 52, as shown in FIGS. 1 and 2, is composed of the main board 53 and the sensor board 54 arranged hierarchically relative to the main board 53 and the stroke sensor 70 is mounted on the sensor board 54. The sensor board 54 is positioned between the main board 53 and the bottom floor 51E of the accommodating region 56, closer to the main body 51A of the housing 51.

Figure 4:
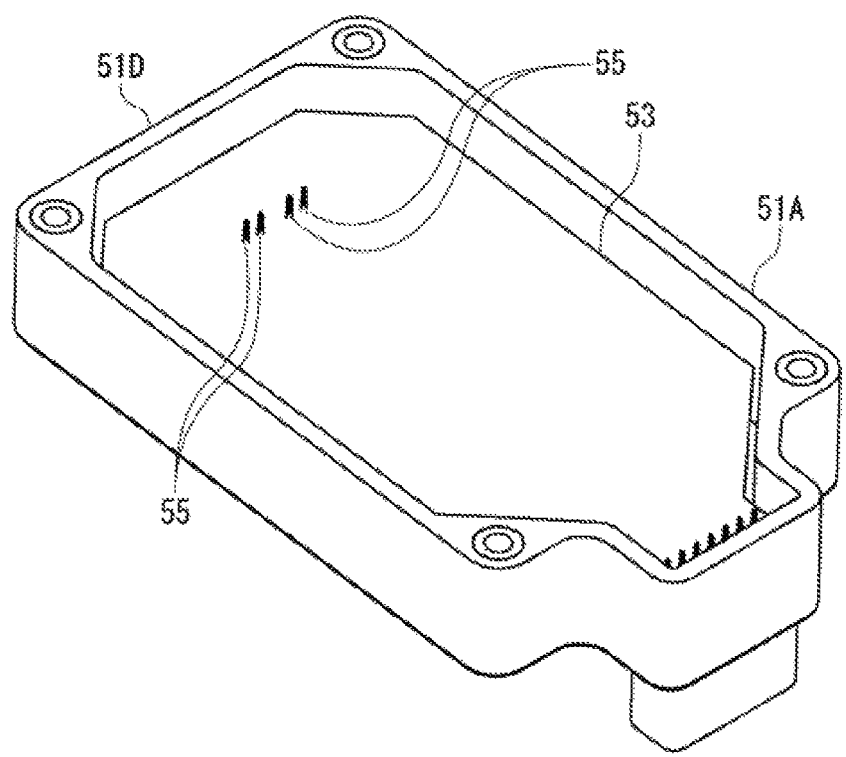
FIG. 4 is a perspective view of the brake control unit of the input device of FIG. 1 with the main board.

The main board 53, as shown in FIGS. 1 and 4, is supported with the connection terminal 55 in the internal space of the housing 51. The main board 53 receives an input of information on running conditions fed from the vehicle in addition to a sensed value fed from the stroke sensor 70, and controls each actuator (not shown) of a fluid pressure control device (not shown) for supporting stabilization of behavior of the vehicle on the basis of a stored program. Specifically, in the embodiment, the main board 53 controls opening and closing operation of a solenoid valve (not shown) for switching the communication state of an oil path, and/or the number of revolutions of a motor (not shown) for driving a motor cylinder (not shown) for generating brake fluid pressure.

The sensor board 54, as shown in FIG. 7, is mounted with the stroke sensor 70 on a bottom face 54B of a board main body 54A and inside the sensor accommodating portion 51F inserted into a groove 10A2 formed in the right side face 10A1. The stroke sensor 70, as shown in FIG. 1, is positioned opposite the permanent magnet 75 of the master cylinder 20, facing the permanent magnet 75 across the base 10 and the peripheral wall of the piston 22. The stroke sensor 70 is thereby positioned at a shortest distance from the permanent magnet 75 in the housing 51, and senses forward/backward movement of the permanent magnet 75, sensing a sliding stroke of the piston 22.

The sensor board 54, as shown in FIG. 5A, has the through-holes 60A, 60B, 60C, 60D formed in the vicinity of the four corners for being press-fitted with the connection terminals 55A, 55B, 55C, 55D. By providing an electrode to an inner periphery of each of the through holes 60A to 60D, a hollow-structured electrical conductor is formed. The hollow-structured electrical conductor is electrically connected with the stroke sensor 70 via a wiring pattern of the sensor board 54.

The four through-holes 60A to 60D, in this example, are positioned in the vicinity of vertices of the rectangle. The connection terminals 55A, 55B connected to the two through-holes 60A, 60B arranged in a rightward/leftward direction in FIG. 5A are prevented from interfering with each other. That is, the connection terminal 55A extends straight in a planar direction, whereas the connection terminal 55B is so bent in an L-shape near the through-hole 60B as to circumvent the connection terminal 55A. The same applies to the connection terminals 55C, 55D connected to the through-holes 60C, 60D.

Figure 5B:
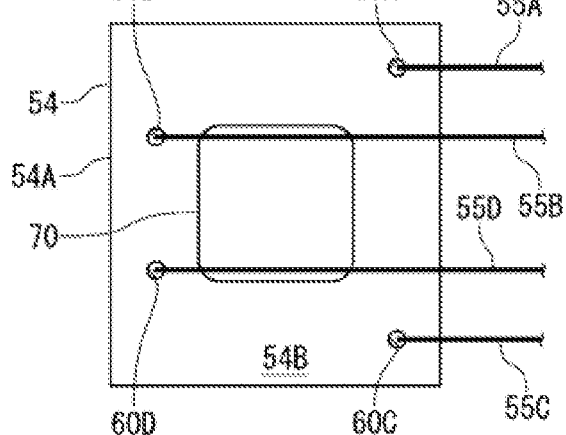
FIG. 5B is a bottom plan view of another embodiment of the sensor board.

FIG. 5B shows an embodiment of the sensor board 54 avoiding interference between the connection terminal 55A and the connection terminal 55B and between the connection terminal 55C and the connection terminal 55D and dispensing with bending of the connection terminals 55B, 55D. An interval between the two through-holes 60A, 60C arranged along one of opposite two sides is made larger than an interval between the two through-holes 60B, 60D arranged along the other of the opposite two sides. This causes the positions of the through-holes 60A, 60B arranged in an extending direction of the connection terminals 55A, 55B to be out of alignment, and causes the positions of the through-holes 60C, 60D arranged in an extending direction of the connection terminals 55C, 55D to be out of alignment, and therefore all of the connection terminals 55A, 55B, 55C, 55D can be uniformly formed into a shape extending straight in the planar direction.

Figure 5C:
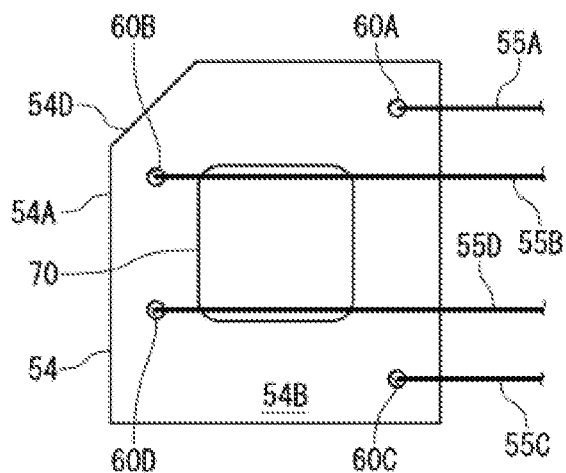
FIG. 5C is a bottom plan view of another embodiment of the sensor board.

The sensor board 54 in the embodiment shown in FIG. 5C has a shape for enabling the connection terminals 55A, 55B, 55C, 55D to be press-fitted into the sensor board 54 without making a mistake in the orientation thereof. The sensor board 54 is formed into an asymmetrical planar shape by providing a chamfer 54D at one corner of the sensor board 54. In order to make similar a planar shape of the accommodating region 56 defined by the inner peripheral face 58A of the accommodating recess 58 to the planar shape of the sensor board 54, an abutting face 59 for abutting on the chamfer 54D of the sensor board 54 is provided by filling in one corner of the inner peripheral face 58A of the accommodating recess 58 in a triangular shape, as shown in FIG. 2. Thereby, it is possible to visually confirm that the orientation of the sensor board 54 is correct when the chamfer 54D at the one corner of the sensor board 54 and the abutting face 59 provided on the inner peripheral face 58A of the accommodating region 56 conform to each other, and it is impossible to press-fit the connection terminal 55 into the sensor board 54 with a wrong orientation thereof.

Figure 6A:
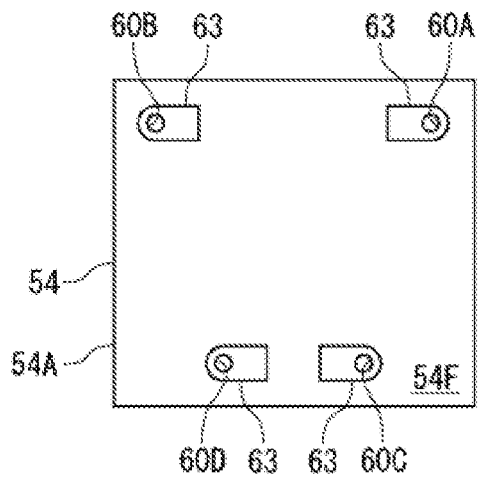
FIG. 6A is a top plan view of an embodiment of the sensor board.

Before installation in the brake control unit 50, the sensor board 54 undergoes an inspection to determine whether or not the sensor board 54 operates properly. The inspection is performed in addition to other processing, such as writing a program for the stroke sensor 70 of the sensor board 54. For convenience when processing, as shown in FIG. 6A, an external connection pad 63 is provided around each of the through-holes 60A to 60D. The external connection pad 63 is made of a conductive metal material, electrically connected to the electrode provided on the inner periphery of each of the through-holes 60A to 60D, and led out to a predetermined position on a top face 54F of the board main body 54A. The stroke sensor 70 is provided on the bottom face 54B of the board main body 54A, while the external connection pads 63 are provided on the top face 54F where a mounted component, such as the stroke sensor 70 of the sensor board 54, is not positioned. In order to perform processing to the stroke sensor 70 of the sensor board 54, a terminal of a device for performing programming or the like is brought into contact with the external connection pads 63 to exchange necessary information between the stroke sensor 70 and the device.

Figure 6B:
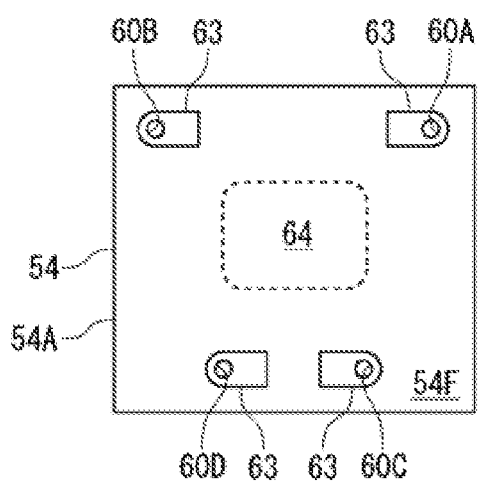
FIG. 6B is a top plan view of another embodiment of the sensor board.

FIG. 6B shows an embodiment of the sensor board 54 taking handling into consideration. The sensor board 54 of FIG. 6B is adapted for transportation of the sensor board 54 by air suction, and has a suction face 64 with a flat face subjected to air suction in the top face 54F. The stroke sensor 70 and the wiring pattern for connecting the stroke sensor 70 and the electrodes are not provided on the suction face 64. For example, by providing all elements, such as the stroke sensor 70 and the electrodes, on the bottom face of the sensor board 54, the suction face 64 can be provided on the top face 54F. Alternatively, with the suction face 64 provided on the top face 54F, the stroke sensor 70 and the wiring pattern or the like can also be provided on the top face 54F as to avoid the suction face 64.

Figure 6C:
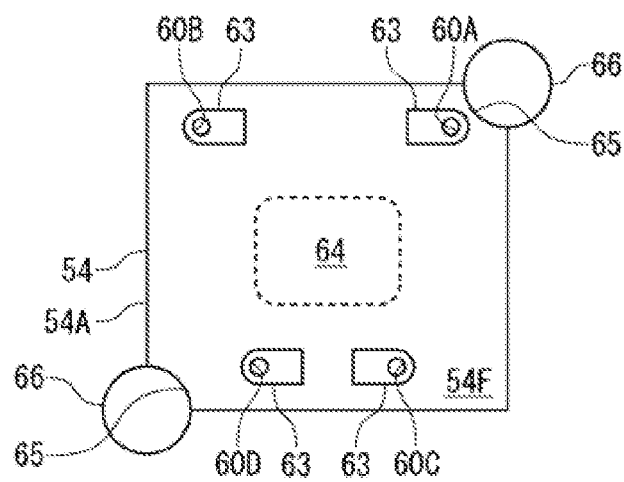
FIG. 6C is a top plan view of another embodiment of the sensor board.

An embodiment of the sensor board 54 shown in FIG. 6C retains the sensor board 54 at a fixed position during programming. The sensor board 54 has circular-arc-like locating regions 65, 65 formed by cutting out two corners located diagonally. During programming, by fitting the locating regions 65, 65 to circular-cylindrical locating guides 66, 66 that fit tightly into the locating regions 65, 65, the sensor board 54 can be retained at the fixed position. Though the plurality of locating guides 66, 66 and the plurality of locating regions 65, 65 have been shown here by way of example, a single locating guide 66 and a single locating region 65 may alternatively be provided.

The main board 53 is positioned at an interval from the right side face 10A1 of the base 10 and, as shown in FIG. 1, the coil C is positioned in a space created by the interval. The sensor board 54 is positioned in such a space for positioning the coil C. In addition, though the stroke sensor 70 is shown in FIG. 1 being proximate to the right side face 10A1 of the base 10, a predetermined gap may be provided between the stroke sensor 70 and the right side face 10A1. Furthermore, though the stroke sensor 70 is shown opposite the permanent magnet 75 across the base 10 and the peripheral wall of the piston 22, the stroke sensor 70 is not limited thereto, and may not be opposite the permanent magnet 75 in an initial position of the master cylinder 20 when the brake pedal is not stepped on.

The sensor board 54 is provided with the external connection pads 63 on the top face 54F, on which the stroke sensor 70 that is a mounted component is not positioned, and electrically connected to the hollow-structured electrical conductors including the through-holes 60A to 60D. Therefore, before the sensor board 54 is press-fitted to the connection terminals 55 of the housing 51 and thus loaded, programming can be performed with the terminal of the programming device brought into contact with the external connection pads 63, and a predetermined inspection can easily be performed with a terminal of an inspection device brought into contact with the external connection pads 63. Even when the sensor board 54 fails the inspection, removing the sensor board 54 from the housing 51 of the brake control unit 50 is not required.

In addition, the sensor board 54 has the through-holes 60A to 60D, and the external connection pad 63 is provided for each of the four through-holes 60A to 60D, and moreover, the four external connection pads 63 are electrically independent. Therefore, it is possible to select a suitable one from the external connection pads 63 and bring the external terminal into contact therewith to perform necessary processing, including an inspection.

The sensor board 54 has the four through-holes 60A to 60D formed along a peripheral edge thereof. Therefore, even when external terminals are required to be brought into contact with the plurality of external connection pads 63 in order to perform necessary processing, including an inspection, the external terminals can avoid interfering with each other.

In addition, since the four through-holes 60A to 60D are formed at the four corners of the sensor board 54, the sensor board 54 is supported at four points by press-fitting the connection terminals 55A, 55B, 55C, 55D into the through-holes 60A, 60B, 60C, 60D, respectively. Therefore, support for the sensor board 54, for example, screw clamping or thermal bonding, is not required.

The sensor board 54 has the flat suction face 64 over a predetermined area on a face where the external connection pads 63 are formed. Therefore, when the sensor board 54 is handled by air suction toward the connection terminals 55, the suction can be reliably secured. In addition, since the sensor board 54 is provided with the locating regions 65, 65 corresponding to the locating guides 66, 66, the sensor board 54 can easily be located by fitting the locating guides 66, 66 into the locating regions 65, 65.

Though the embodiment described above shows an example where four identical external connection pads 63 are provided, the number of external connection pads in the present invention is not limited and, in addition, the shapes and/or dimensions of the plurality of external connection pads 63 may be different from each other. Though the embodiment described above shows an example where the suction face 64 is provided on the top face 54F of the board main body 54A on which a Hall IC is not provided, the present invention allows the suction face 64 to be provided on a face on which a mounted component, such as a Hall IC, is provided. This form requires the suction face 64 to be so provided as to avoid a region where such a mounted component is mounted, and therefore, normally, the suction face 64 is provided at a marginal portion out of the center of the sensor board 54 in such an embodiment.

What is claimed is:

1. A printed circuit board, comprising:
    a board main body having a top face and a bottom face opposite the top face;
    a sensor mounted on one of the top face and the bottom face of the board main body;
    an external connection pad provided only on the other of the top face or the bottom face of the board main body without the sensor mounted thereon; and
    a hollow-structured electrical conductor extending through the board main body and electrically connecting the sensor to the external connection pad,
    wherein the external connection pad is provided around an opening of the hollow-structured electrical conductor.

2. The printed circuit board of claim 1, further comprising a plurality of hollow-structured electrical conductors extending through the board main body, wherein each of the plurality of hollow-structured electrical conductors defines a through-hole extending through the board main body.

3. The printed circuit board of claim 2, further comprising a plurality of external connection pads, wherein each of the plurality of hollow-structured electrical conductors is formed through and electrically connected to a respective one of the plurality of external connection pads.

4. The printed circuit board of claim 3, wherein the plurality of external connection pads are electrically independent.

5. The printed circuit board of claim 2, wherein the plurality of hollow-structured electrical conductors are formed along a peripheral edge of the board main body.

6. The printed circuit board of claim 5, further comprising a plurality of connection terminals, wherein the board main body has a shape with four corners and the plurality of hollow-structured electrical conductors are formed at the four corners of the board main body and each of the plurality of connection terminals are press-fitted into a respective one of the plurality of hollow-structured electrical conductors for mechanically supporting the printed circuit board.

7. The printed circuit board of claim 1, wherein the board main body has a flat suction face formed over a predetermined area on the one of the top face and the bottom face of the board main body on which the external connection pad is disposed.

8. The printed circuit board of claim 1, wherein the board main body includes a locating region corresponding to an external locating guide.

9. The printed circuit board of claim 1, wherein the board main body has an asymmetrical shape with a chamfer at one of a plurality of corners of the board main body.

10. The printed circuit board of claim 3, further comprising a plurality of connection terminals electrically connected to the plurality of hollow-structured electrical conductors and the plurality of external connection pads.

11. The printed circuit board of claim 10, wherein the plurality of connection terminals are press-fitted into the plurality of hollow-structured electrical conductors.

12. The printed circuit board of claim 11, wherein the board main body has a shape with four corners defining a first side and an opposite second side.

13. The printed circuit board of claim 12, wherein a first pair of the plurality of hollow-structured electrical conductors are aligned along the first side and spaced apart by a first interval and a second pair of the plurality of hollow-structured electrical conductors are aligned along the second side and spaced apart by a second interval.

14. The printed circuit board of claim 13, wherein the first interval is equal to the second interval.

15. The printed circuit board of claim 14, wherein a first connection terminal connected to one of the first pair of the plurality of hollow-structured electrical conductors extends straight in a planar direction and a second connection terminal connected to one of the second pair of the plurality of hollow-structured electrical conductors extends in an L-shape.

16. The printed circuit board of claim 13, wherein the first interval is greater than the second interval.

17. The printed circuit board of claim 16, wherein the plurality of connection terminals each extend straight in a planar direction to the first pair of the plurality of hollow-structured electrical conductors and the second pair of the plurality of hollow-structured electrical conductors.

18. The printed circuit board of claim 1, wherein the board main body has a flat suction face formed over a predetermined area on the one of the top face and the bottom face of the board main body on which the sensor is disposed.

* * * * *